United States Patent [19]

Johnson et al.

[11] 4,247,737

[45] Jan. 27, 1981

[54] ELECTROMAGNETICALLY SHIELDED VIEWING WINDOW

[75] Inventors: Arthur J. Johnson, Erie; Herbert G. Bostrom, Fairview, both of Pa.

[73] Assignee: Spectrum Control, Inc., Fairview, Pa.

[21] Appl. No.: 24,894

[22] Filed: Mar. 29, 1979

[51] Int. Cl.³ ............................................. H05K 9/00
[52] U.S. Cl. ............................................... 174/35 MS
[58] Field of Search ..................... 174/35 MS, 35 R; 219/10.55 D

[56] References Cited

U.S. PATENT DOCUMENTS

| | | | |
|---|---|---|---|
| 2,860,176 | 11/1958 | Lindgren | 174/35 MS |
| 2,958,754 | 11/1960 | Hahn | 219/10.55 D |
| 3,305,623 | 2/1967 | Bakker et al. | 174/35 MS |
| 4,010,343 | 3/1977 | Tanaka | 174/35 MS X |
| 4,049,939 | 9/1977 | Katona | 174/35 MS X |

Primary Examiner—C. L. Albritton
Assistant Examiner—D. A. Tone
Attorney, Agent, or Firm—Merriam, Marshall & Bicknell

[57] ABSTRACT

An electromagnetically shielded viewing window for an enclosure including a wire mesh member formed of respective crossing wires bonded between a pair of transparent panels, wherein the wire cross points are joined by nickel/copper plating of the wire mesh without covering the mesh open areas. A dull coating of antiqued silver is applied to the plated wire mesh to reduce window glare. A wire gasket extends around the panel perimeter, and a wire mesh portion projects beyond one of the panels and overlies the wire gasket to reliably ground the wire mesh when mounted to the enclosure.

7 Claims, 5 Drawing Figures

ELECTROMAGNETICALLY SHIELDED VIEWING WINDOW

This invention relates to electromagnetic shielding devices and more particularly to an improved electromagnetically shielded viewing screen or window.

BACKGROUND OF THE INVENTION

In certain electronic display equipment, such as a cathode ray tube enclosure, it is required to provide a viewing window having desired optical characteristics, such as good light transmission, reduced glare, and reflection, etc., while also incorporating in such windows electromagnetic shielding characteristics to prevent or reduce the transmission of any electromagnetic energy in the microwave frequency range through the window.

One type of presently available electromagnetically shielded viewing window incorporates a knit wire mesh sandwiched between two layers of glass or plastic panels. The type of shielding mesh chosen generally constitutes a compromise between a desired mass of highly conductive screening across the window opening so as to provide maximum electromagnetic shielding and a desired maximum amount of viewing capability through the window, unobstructed by the shielding screen. Typically, such shielding meshes comprise a loose knit mesh of approximately 18 openings per inch which is formed from a loosely knit mesh with a wire diameter ranging from 0.001–0.005 inch diameter. Typically, grounding of the mesh material is provided by a wire gasket contacting the mesh screen around the perimeter of the viewing window with the wire gasket in turn contacting a metallic window frame in the enclosure. In view of the light reflective characteristics of the embedded metallic mesh, it is often necessary to apply a coating or finish to the glass or plastic window. As an example, when utilizing an electromagnetically shielded viewing window of this type in front of a display element, such as a cathode ray tube, it is often necessary to apply a coating to the glass or plastic panels to increase the contrast between the cathode ray tube display characters and the shielding mesh background.

Thus, the desirable characteristics of an electromagnetically shielded viewing window require a design compromise between the use of a highly conductive screen to provide the most efficient electromagnetic shielding protection; a fairly substantial open area of shielding mesh to enable maximum light transmission through the mesh; and the need for a non-glare or non-reflective viewing surface. It is therefore desirable to provide an electromagnetically shielded viewing window incorporating the most highly attainable characteristic of optical transmission, electromagnetic shielding, and anti-reflection in a viewing window constructed with the same or less cost than in the prior art.

SUMMARY OF THE INVENTION

In accordance with the principles of the present invention, there is provided an improved electromagnetically shielded viewing window of the type wherein a wire mesh is sandwiched between two layers of transparent glass or plastic panels. The loose wire mesh is initially subjected to an underplating of conductive material such as nickel and copper so as to cover and fuse or electrically bond all of the wire cross-over points or joints in the mesh without also covering the open areas. This provides very low resistance or high conductivity points throughout the mesh enabling the mesh to exhibit shielding characteristics approaching a uniform flat conductive sheet across the viewing window. The underplated wire mesh screen is then silver plated and finally oxidized to dull the finish to an even blue/black color to reduce the window glare and therefore increase the background contrast.

In the assembled viewing window, the perimeter of the wire mesh overlays a wire gasket (rather than underlaying the gasket as in the prior art) to enable a reliable grounding of the mesh screen to a metallic window frame in an enclosure. This more reliable perimeter grounding configuration combined with the fused or electrically bonded mesh screen enables a significant improvement to be obtained in shielding effectiveness as compared to the prior art viewing windows. As an example, increases in shielding effectiveness on the average of more than 20db over a frequency range of 1 MHz to 1 GHz was obtained utilizing the viewing window constructed in accordance with the principles of the present invention as compared to a prior art viewing window of the electromagnetically shielded type.

DETAILED DESCRIPTION

Figure 1:
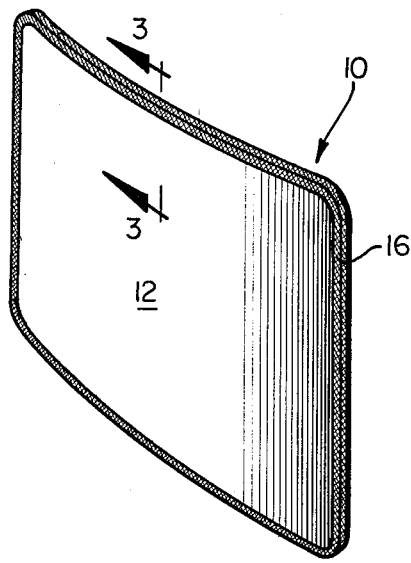
FIG. 1 is a perspective view illustrating an electromagnetically shielded viewing window constructed in accordance with the principles of the present invention.
Figure 2:
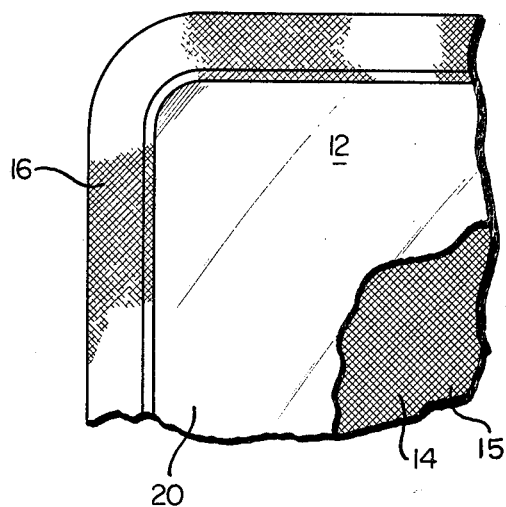
FIG. 2 is a fragmentary, partially cut away view of one corner of the viewing window shown in FIG. 1.
Figure 3:
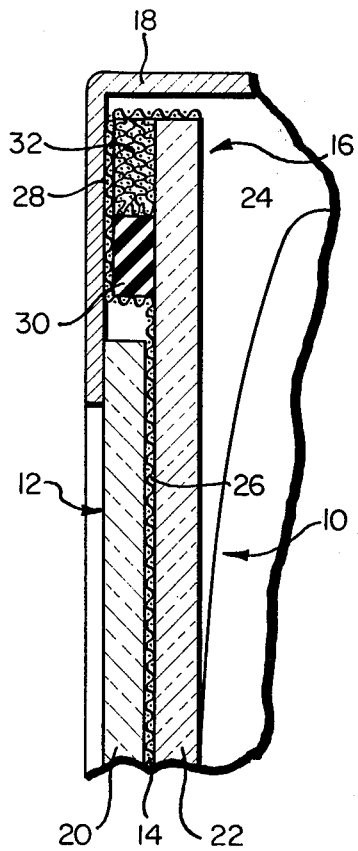
FIG. 3 is a sectional view taken along section lines 3—3 of FIG. 1, illustrating the details of a perimeter ground provided in one embodiment of the present invention.

Referring now to FIG. 1, there is illustrated an electromagnetically shielded viewing window 10 constructed in accordance with the principles of the present invention and including generally a viewable or display area 12 ecompassed by a shielding mesh 14 of a particular construction described hereinafter, and surrounded by a grounded perimeter portion 16. One embodiment of the invention is shown in FIG. 3, wherein there is illustrated the viewing window 10 mounted in position on an enclosure frame 18. The viewing portion 12 coincides with an open portion of the frame and the grounding perimeter 16 is in grounding contact with a mating ground on the frame 18.

As is illustated in the sectional view of FIG. 3, the electromagnetically shielded viewing window 10 includes the shielding mesh 14 sandwiched between a front panel 20 and back panel 22, each of the panels being formed of glass or plastic so that light may be transmitted through the panels and be viewable from the viewing portion 12. As can be seen most clearly from FIG. 3, back panel 22 is slightly larger than front panel 20, so that a portion 24 thereof extends beyond panel 20 on all sides and forms a backing for the ground perimeter 16. Suitable adhesives or bonding materials may be utilized for bonding the panel components together in a manner known in the art.

From FIG. 3, it can be seen that the shielding mesh 14 includes a first portion 26 sandwiched between panels 20, 22, and a second portion 28 extending around an elastomer gasket 30 and a wire mesh gasket 32. Thus, the shielding mesh portion 26 is reliably grounded directly to the mating frame ground portion 18 rather than being indirectly and thus unreliably grounded through one or more elements as in the prior art. It is understood, of course, that suitable mounting or clamping means (not shown) maintain the viewing window 10 against the frame 18 with the grounding perimeter compressingly engaging the frame. Elastomer gasket 30 may be formed of rubber or other elastomeric material of sufficient resiliency and stiffness to maintain mesh portion 28 in intimate electrical contact with frame 18.

Figure 4:
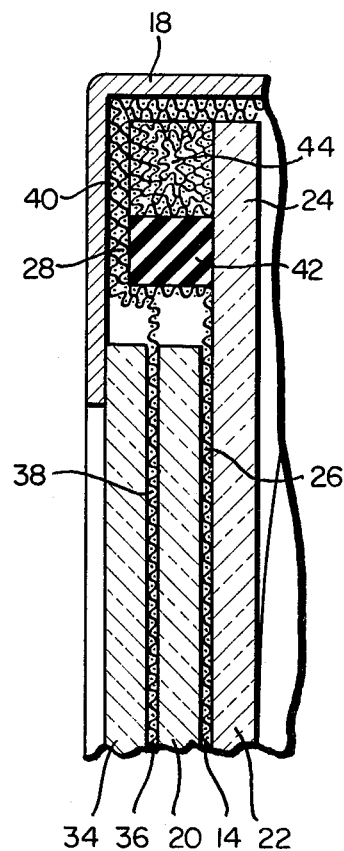
FIG. 4 is a partial sectional view similar to that of FIG. 3, but illustrating another perimeter ground in a double layer embodiment of the present invention.

An alternative embodiment is shown in FIG. 4 wherein for convenience the same grounding frame 18 is illustrated. In FIG. 4, two electromagnetically shielded layers are utilized. In particular, in addition to the panels 20 and 22 with the sandwiched shielding mesh 14, there is also included panel 34 and a shielding mesh 36 sandwiched between panels 34 and 20. In this configuration, shielding mesh portion 38 extends between panels 34 and 20. A portion 40 of wire mesh 36 as well as the portion 28 of mesh 14 both extend around an elastomer 42 and a wire mesh gasket 44 to be reliably grounded directly through the mating frame ground portion 18.

Figure 5:
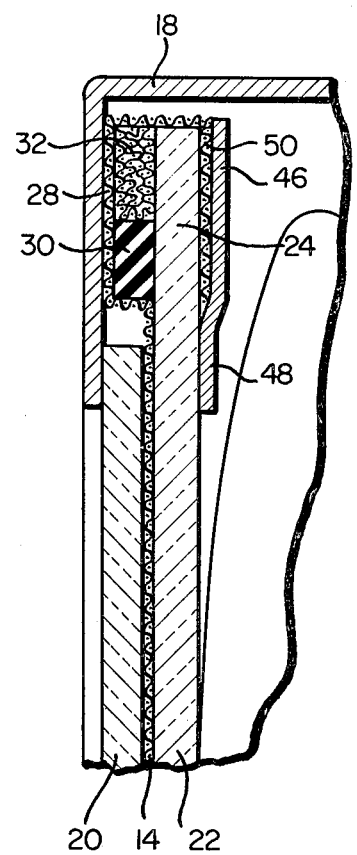
FIG. 5 is a partial sectional view similar to that of FIGS. 3 and 4, but illustrating still another perimeter ground provided in a third embodiment of the present invention.

FIG. 5 illustrates still another embodiment of the invention wherein in addition to the shielding mesh portion 28 being grounded directly to the mating frame ground portion 18, a secondary grounding member is also provided. In this configuration, a conductive tape 46 includes one portion 48 adhering to back plate 22 and another portion securing an extension 50 of mesh 14.

Shielding mesh 14 preferably is formed of a 100×100 type 316 stainless steel woven wire having a wire diameter of 0.0023 inch, an opening of 0.0077 inch defined between adjacent wires (or about 100 openings per inch), and an open area of 60% relative to the total mesh area. The wire mesh may be formed of any metallic material with wire diameters ranging from about 0.0005 to 0.010 inch and woven with about 40 to 75% open area. The metallic mesh material must also be capable of being fused at the wire cross points and treated for anti-glare as next described.

In accordance with another aspect of the invention, the normally loosely woven shielding mesh 14 is subjected to plating and finishing so that when utilized in the illustrated combination superior electromagnetic shielding effectiveness is obtained as compared to such prior art types of viewing windows. In particular, shielding mesh 14 is subjected to an underplating of nickel and cooper. This underplating fuses or electrically bonds all wire cross-over points which are normally loose and unbonded in such mesh. Thus, each cross-over joint 15 is made a very low resistance point due to the nickel/copper plating at the cross-over joint, and the plated mesh 14 therefore presents a highly conductive surface across the display portion 12. It is understood, of course, that only a very thin layer of nickel and copper underplating is applied. That is, the plating thickness should be sufficient to join or bond the wires at the wire cross-over joints 15, but not sufficient to cover the open area of the mesh defined between respective crossing wires. As an example, it has been found that cleaning, pickling and plating the wire mesh with thicknesses of 0.00005 inch nickel strike and 0.0005 inch copper sufficiently bonds the joints 15 and provides the substantially uniform, highly conductive surface in accordance with the present invention.

The nickel/copper underplated shielding mesh 14 is then plated with silver and thereafter antiqued to provide an anti-glare finish on the shielding mesh. For example, the underplated mesh screen 14 can be plated with a thickness of 0.0002 inch minimum silver plate and thereafter subjected to a bath of hydrogen sulfide (or equivalent) for a period of time required to oxidize the silver plating to a dull even blue/black color. Thus, the specially treated shielding mesh 14 in accordance with the present invention provides a glare free, highly conductive surface useful as a laminate in the viewing window 10. Particularly when the shielding mesh 14 is incorporated in the perimeter grounded configuration illustrated in the sectional details of FIGS. 3-5 herein, the viewing window 10 provides fully acceptable light transmission with anti-glare properties, and with a significant increase in shielding effectiveness over the prior art.

To illustrate the shielding effectiveness of the treated mesh 14, two viewing windows were constructed. Both windows incorporated the unique grounding perimeter configuration illustrated herein, however, one incorporated a specially plated and antiqued 100 mesh screen as described herein, and the other incorporated an untreated prior art 130 needleknit, loose mesh screen. Both panels were then subjected to test frequencies at discrete intervals between a range of 1.0 MHz through 1,000 MHz (1.0 GHz). At each discrete test frequency interval over this entire range the viewing window in accordance with the present invention provided at least 15 db better shielding than the prior art viewing window, and between the range of 100 MHz through 1 GHz the viewing screen according to the present invention provided about at least 20 db better shielding effectiveness than the prior art viewing window. Such features have been provided in the viewing window of the present invention without applying any anti-glare or anti-reflection coatings on the glass or plastic window panels as required in the prior art.

While particular embodiments of the present invention have been shown and described, it will be obvious to those skilled in the art that various changes and modifications may be made without departing from the invention in its broader aspects. Accordingly, the aim of the appended claims is to cover all such changes and modifications as may fall within the true spirit and scope of the invention.

What is claimed is:

1. An electromagnetically shielded viewing window for an enclosure comprising:
   a pair of spaced, substantially transparent panels;
   a wire mesh coextensively extending intermediate said panels, said wire mesh formed of respective crossing conductive wires;
   conductive means joining said respective crossing conductive wires at each crossing and defining an open area therebetween;
   said conductive means including a conductive plating material on said wire mesh sufficient to conductively join said conductive wires only at each crossing;
   a wire gasket extending around the perimeter of at least one side of said panels; and a portion of said wire mesh projecting beyond one of said panels and being in overlying conductive engagement with said wire gasket for groundably mounting to said enclosure.

2. An electromagnetically shielded viewing window according to claim 1, wherein said conductive plating material comprises nickel and copper.

3. An electromagnetically shielded viewing window according to claim 1, wherein said wire mesh comprises a mesh of woven metallic wires having diameters between about 0.0005 to 0.010 inch with about 40 to 75% open area.

4. An electromagnetically shielded viewing window according to claim 3, wherein said wire mesh comprises a mesh of stainless steel woven wire having a diameter of about 0.0023 inch, with about 100 openings per inch and an open area of about 60%.

5. An electromagnetically shielded viewing window according to claim 1, wherein said wire mesh includes a dull coating to reduce optical reflection from said wire mesh.

6. An electromagnetically shielded viewing window according to claim 1, including an elastomeric gasket extending around the perimeter of one of said panels and intermediate said panel and said projecting portion of wire mesh.

7. An electromagnetically shielded viewing window according to claim 1, including an additional, substantially transparent panel adjacent said pair of panels,
a second wire mesh coextensively extending intermediate said additional panel and said pair of panels, said second wire mesh formed of respective crossing conductive wires, including conductive means joining said respective crossing conductive wires at each crossing and defining an open area therebetween; and
a portion of said second wire mesh projecting beyond said one panel and being in overlying conductive engagement with said wire gasket and said first mentioned portion of said wire mesh.

* * * * *